United States Patent
Dagher et al.

(10) Patent No.: US 11,041,992 B2
(45) Date of Patent: Jun. 22, 2021

(54) HINGE FOR MICRO AND NANOELECTROMECHANICAL SYSTEMS WITH OUT-OF-PLANE DISPLACEMENT AND REDUCED NON-LINEARITY

(71) Applicant: COMMISSARIAT A L'ENERGIE ATOMIQUE ET AUX ENERGIES ALTERNATIVES, Paris (FR)

(72) Inventors: Samer Dagher, Grenoble (FR); Loic Joet, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/721,578

(22) Filed: Dec. 19, 2019

(65) Prior Publication Data
US 2020/0200976 A1 Jun. 25, 2020

(30) Foreign Application Priority Data
Dec. 20, 2018 (FR) ...................................... 18 73561

(51) Int. Cl.
*H04R 19/04* (2006.01)
*G02B 6/35* (2006.01)
(Continued)

(52) U.S. Cl.
CPC ......... *G02B 6/3518* (2013.01); *G02B 26/085* (2013.01); *G02B 27/56* (2013.01); *H04R 19/04* (2013.01)

(58) Field of Classification Search
CPC .......... B81B 2203/06; B81B 2203/053; B81B 3/0048
See application file for complete search history.

(56) References Cited

U.S. PATENT DOCUMENTS

| 8,371,166 | B2 | 2/2013 | Robert |
| 2011/0123052 | A1* | 5/2011 | Bominaar-Silkens ...................... H04R 19/005 381/174 |
| 2013/0107339 | A1 | 5/2013 | Horie et al. |

FOREIGN PATENT DOCUMENTS

| FR | 2 941 533 A1 | 7/2010 |
| WO | WO 01/98786 A1 | 12/2001 |

OTHER PUBLICATIONS

M. Despont et al., "Dual-cantilever AFM probe for combining fast and coarse imaging with high-resolution imaging," Proceedings IEEE Thirteenth Annual International Conference on Micro Electro Mechanical Systems, 2000, pp. 126-131.*

(Continued)

*Primary Examiner* — Omar R Rojas
(74) *Attorney, Agent, or Firm* — Oblon, McClelland, Maier & Neustadt, L.L.P.

(57) ABSTRACT

A hinge between a first part and a second part of a microelectromechanical system including a first element and a second element free to move relative to each other in an out-of-plane direction is disclosed. The hinge includes a first rigid part; a second part fixed to a first face of the first part by one end and anchored to the second element by a second end, the second part deforming in bending in the out-of-plane direction; and a third part fired to a first face of the first part by a second end, and anchored to the first element by a second end, the third part deforming in bending in the out-of-plane direction. In an undeformed state, the second part and the third part each includes one face located in the same plane orthogonal to the out-of-plane direction.

18 Claims, 4 Drawing Sheets

(51) Int. Cl.
G02B 26/08 (2006.01)
G02B 27/56 (2006.01)

(56) References Cited

OTHER PUBLICATIONS

French Preliminary Search Report dated Sep. 25, 2019 in French Application 18 73561 filed on Dec. 20, 2018 (with English Translation of Categories of Cited Documents), 2 pages.

* cited by examiner

HINGE FOR MICRO AND NANOELECTROMECHANICAL SYSTEMS WITH OUT-OF-PLANE DISPLACEMENT AND REDUCED NON-LINEARITY

TECHNICAL DOMAIN AND STATE OF PRIOR ART

This invention relates to a hinge for micro- and nanoelectromechanical systems providing at least reduced non-linearity and a system making use of at least two such hinges.

Microelectromechanical or MEMS systems and micro & nanoelectromechanical systems or M&NEMS systems are used to make sensors or actuators. They comprise at least one element free to move relative to a substrate. For example, in the case of a sensor, displacement of the moving part or the mass is measured and can be translated into a characteristic to be detected, for example an acceleration, and in the case of an actuator, the moving element is moved for example by means of electrostatic forces, for example to displace a micromirror.

The moving element is suspended from the substrate and depending on the application, it may be required to have a displacement in the plane of the system or an out-of-plane displacement, i.e. orthogonal to the plane of the system.

When the moving element has a large amplitude displacement in the out-of-plane direction, the connection zone may have large non-linearity.

This non-linear behaviour is illustrated on FIGS. 12A to 12C. The moving mass M is suspended from the substrate S by a hinge A formed from a thin membrane. Displacement of the mass M in the Z direction causes a first order deformation of the membrane in the Z direction and a second order deformation in the X direction. When the displacement of the mass in the Z direction is large, elongation of the membrane in the X direction (FIG. 12B) is no longer negligible. The result is that the return force applied by the membrane on the mass is non-linear (FIG. 12C) and varies widely with displacement in the Z direction. This non-linearity can significantly affect the response of the system, for example in the case of a sensor, and can make it unreliable.

PRESENTATION OF THE INVENTION

Consequently, one purpose of this invention is to provide a hinge for a MEMS or M&NEMS system providing guidance for out-of-plane displacements of at least two moving parts relative to each other, having at least a reduced non-linearity even for large amplitude out-of-plane displacements.

The purpose described above is achieved by a hinge intended to connect a first element and a second element of a MEMS or M&NEMS system, comprising a first part rigid in the three directions in space, at least one second part connected to the first part and intended to be connected to the first element, the second part being deformable in bending in the out-of-plane direction, and at least one third part connected to the first part and that can be deformed in bending in the out-of-plane direction, the second and third parts extending in the same plane when at rest.

The second and third parts are arranged relative to the first part and to the two elements of the system such that during a relative displacement of the first element and the second element in the out-of-plane direction, both the second part and the third part are affected by an in-plane deformation, the amplitudes of in-plane deformations of the second and third parts are at least similar and at least partly compensate. Very advantageously, in-plane deformations of the second and third parts are identical and completely compensate each other.

The result is that the hinge is only slightly or not at all deformed in-plane at the fasteners of the first and second elements, and therefore has little or no non-linearity, even during large amplitude out-of-plane displacements. Regardless of the relative out-of-plane displacement of the two elements, deformations in the plane of the hinge are at least partly compensated.

In other words, very advantageously an articulation is made that at least partly self-cancels in-plane deformations responsible for a non-linear behaviour. The invention does not limit in-plane deformation, but at least partly compensates for it by means of a composite hinge.

The hinge according to the invention also has the advantage that it makes it easy to adjust its stiffness by varying the dimensions of the second and third parts.

Advantageously, the second and third parts are membranes with the same dimensions, thus having the same mechanical behaviour when they are deformed in bending.

Advantageously, an M&NEMS system comprises at least two hinges which gives very good guidance in the out-of-plane direction and at least one guidance in the in-plane direction.

Even more advantageously, the M&NEMS system comprises at least three hinges, and even more advantageously four hinges, so as to provide guidance in the out-of-plane direction and very good retention in the two in-plane directions.

The subject-matter of this invention is then a hinge between at least one first element and at least one second element of a microelectromechanical system, said first element and second elements being free to move relative to each other at least in an out-of-plane direction, said hinge comprising a first rigid part, at least one second part fixed to a first face of the first part by one end and that is intended to be anchored to the first element or to the second element by a second end, the first and second ends of the second part being considered along a second direction, said second part being configured to be deformable in bending in a first direction, at least one third part fixed to the first face of the first part by a first end and that is intended to be anchored to the second element or to the first element by a second end, the first and second ends of the third part being considered along the second direction, the third part being configured to deform in bending in the first direction, and in an undeformed state the second part and the third part being located in the same plane orthogonal to the first direction.

Another subject-matter of this invention is a microelectromechanical system comprising a first element and a second element free to move relative to each other at least in an out-of-plane direction, and at least two hinges according to the invention, each anchored to the first element and to the second element, and the hinges are oriented such that the first direction is the out-of-plane direction and the second and third directions are in-plane directions.

BRIEF DESCRIPTION OF THE DRAWINGS

This invention will be better understood after reading the following description and the appended drawings on which.

DETAILED PRESENTATION OF PARTICULAR EMBODIMENTS

In this application, the term "microelectromechanical system" or "MEMS system" is used to denote a micro and/or nanoelectromechanical system, i.e. a system comprising elements with micrometric dimensions and/or nanometric dimensions.

FIGS. 1 to 4 show an example of a hinge according to the invention. A fixed part or substrate S of a microelectromechanical system and a moving part or mass M that will be suspended from the substrate S by the hinge 2 are shown in dashed lines. It will be understood that the hinge can make the articulation between two parts free to move relative to each other, and free to move relative to a fixed substrate.

The hinge 2 is designed to enable out-of-plane displacement of the moving part M.

The plane of the system is defined by the X and Y directions and corresponds to the median plane of the system in which the moving mass M extends, which is also the median plane of the fixed part.

The out-of-plane direction Z is orthogonal to the plane of the system.

Figure 1:
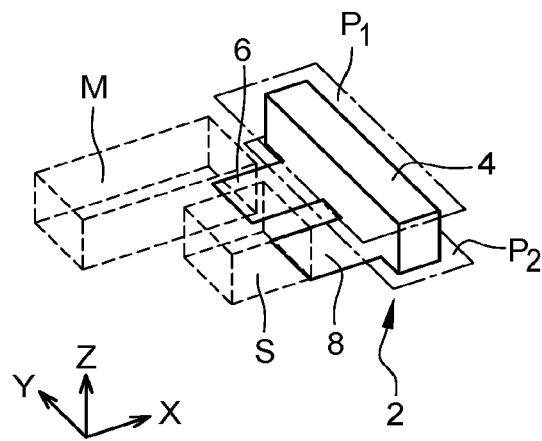
FIG. 1 is a perspective view of an example of a hinge, the elements between which the hinge is arranged being shown in dotted lines.
Figure 2:
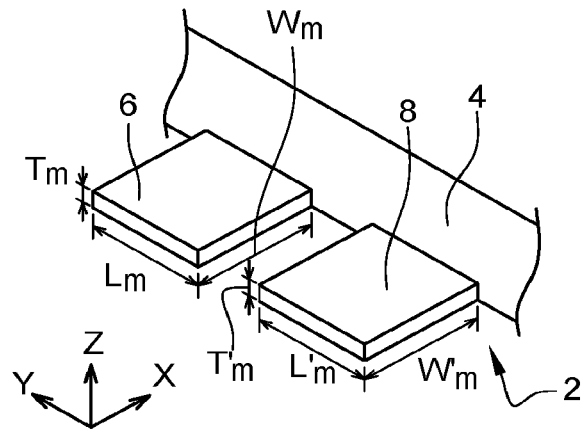
FIG. 2 is a detail view of FIG. 1.
Figure 3:
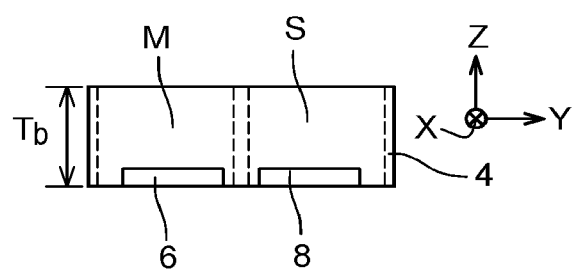
FIG. 3 is a front view of the hinge in FIG. 1.
Figure 4:
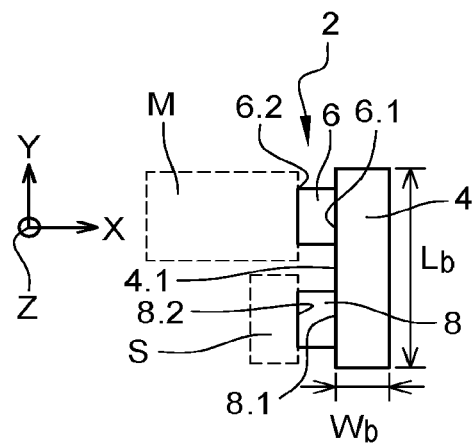
FIG. 4 is a top view of the hinge in FIG. 1.

The mass and the substrate are not represented on FIG. 2.

The hinge comprises a first rigid part 4.

"Rigid part" or "rigid element" means an element that does not deform or that deforms only slightly under the effect of stresses generally applied to a MEMS system in the case of a sensor or actuator during normal operation.

In the example shown, the first part 4 is in the shape of a parallelepiped-shaped beam with a thickness Tb, a width Wb and a length Lb. The first part extends in the Z direction between a first plane P1 and a second plane P2 parallel to each other.

The thickness corresponds to the dimension along Z, the width corresponds to the dimension along X and the length corresponds to the dimension along Y.

For example, the dimensions Tb, Wb and Lb are between several µm and several hundred µm.

The hinge comprises a second part 6 having a thickness Tm that is small compared with its length Lm and its width Wm so as to enable deformation in bending along the Z direction, preferably $1/10 < Tm/Wm < 1/100$ and $1/10 < Tm/Lm < 1/100$.

For example, its thickness Tm is between about a hundred nm and several µm, its length Lm and its width Wm are between several µm and several hundred µm.

The second part 6 is then in the form of a membrane that is fixed by a first edge 6.1 extending along the Y direction to a first side 4.1 of the first part 4, and a second edge 6.2 parallel to the first edge 6.1 and that will be fixed to the mass M.

The second part 6 connects the first part 4 and the mass M. In the example shown, the lower face of the second part at rest is located on plane P2 in which the lower face of the first part 4 is located in the representation shown in FIGS. 1 to 4. Furthermore, in the example shown, the lower face of the mass M is also contained in plane P2.

On FIGS. 1 to 4, the hinge also comprises a third part 8 having a thickness Tm' that is small compared with its length Lm' and its width Wm' so as to enable deformation in bending along the Z direction, preferably $1/10 < Tm'/Wm' < 1/100$ and $1/10 < Tm'/Lm' < 1/100$.

The second part 6 and the third part 8 are configured so as to have similar or identical mechanical behaviours, during an out-of-plane displacement of the moving part M relative to the substrate S.

Preferably, the similar or identical mechanical behaviours are obtained by making second and third parts from the same material or from materials with similar mechanical properties and the same dimensions, in other words $Tm = Tm'$, $Lm = Lm'$ and $Wm = Wm'$. The dimensions are equal within imprecisions related to the manufacturing process.

The third part 8 is then also in the form of a membrane that is fixed by a first edge 8.1 extending along the Y direction to the first edge 4.1 of the first part 4, and a second edge 8.2 parallel to the first edge 8.1 and that will be fixed to the substrate S.

The second part 6 and the third part 8 are connected to the same side of the first part 4 and are located side by side.

The lower face of the third part 8 at rest is also located on plane P2 that delimits the lower face of the first part 4 in the representation shown in FIGS. 1 to 4. The lower faces of the second part 6 and the third part 8 at rest are located on the same plane P2 orthogonal to the out-of-plane direction.

Figure 6:
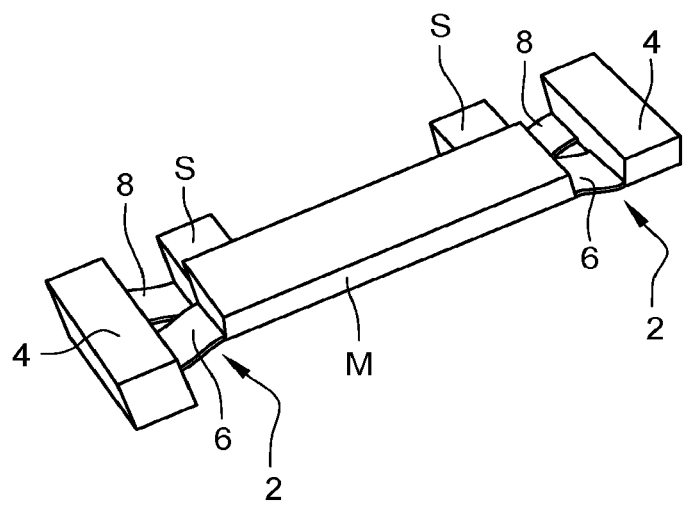
FIG. 6 is a perspective view of an example of an M&NEMS system comprising two hinges in FIG. 1 in an out-of-plane position.
Figure 7:
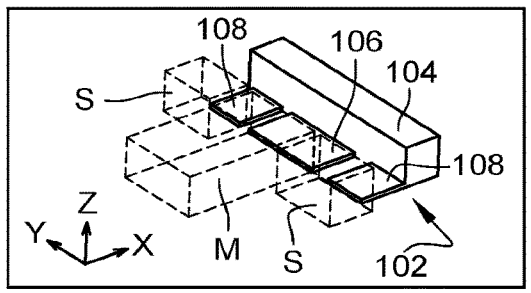
FIG. 7 is a perspective view of another example of a hinge, the elements between which the hinge is arranged being shown in dotted lines.
Figure 8:
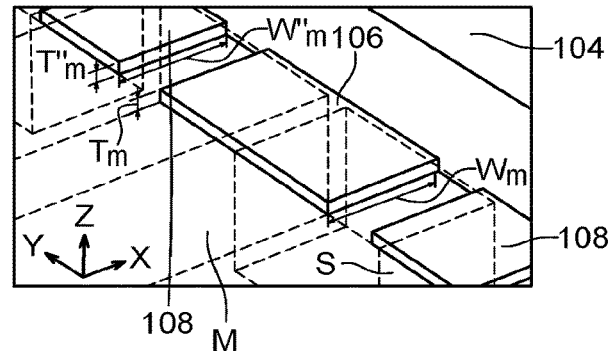
FIG. 8 is a detail view of FIG. 7.
Figure 9:
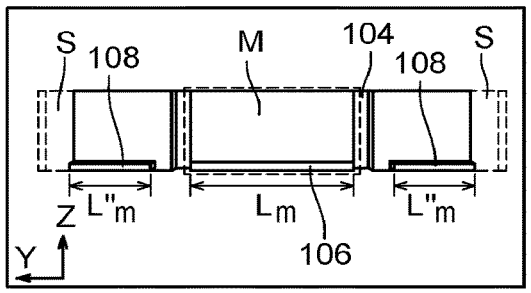
FIG. 9 is a front view of the hinge in FIG. 7.
Figure 10:
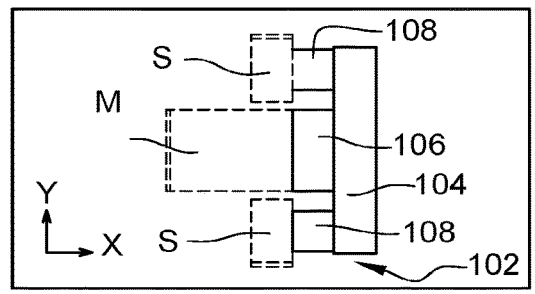
FIG. 10 is a top view of the hinge in FIG. 7.

FIG. 6 illustrates a MEMS system 10 with two hinges 2. The hinges 2 are anchored on the moving part M symmetrically about a median plane of the moving part M parallel to the YZ plane.

The second parts of each hinge are anchored to the parallel faces M.1, M.2 of the moving part M, and the third parts are anchored to the fixed part S.

In the representation in FIG. 6, the moving part M has an upwards out-of-plane movement, the second parts and third parts are deformed in bending.

Figure 5A:
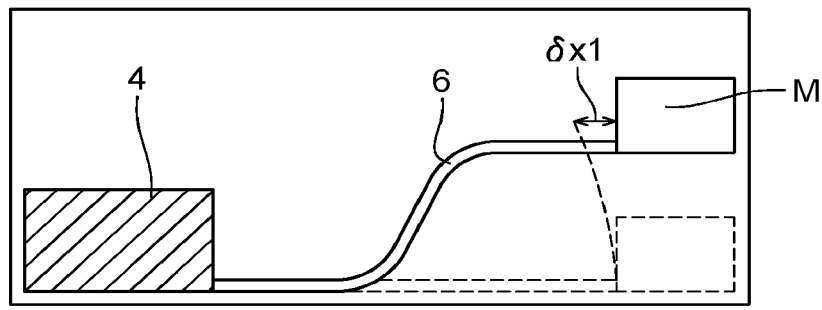
FIG. 5A is a side view diagrammatically representing the second part of the hinge in FIG. 1 in a deformed state.
Figure 5B:
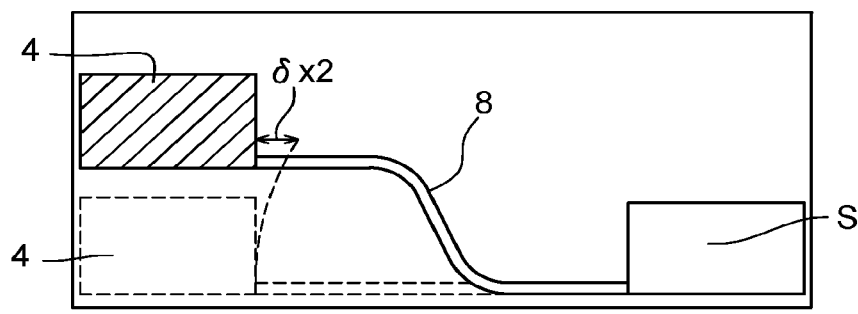
FIG. 5B is a side view diagrammatically representing the third part of the hinge in FIG. 1 in a deformed state.

The operation of the hinge will now be described with reference to FIGS. 5A and 5B that separately show the deformation of a second part and a third part.

Considering the application to a sensor, for example an accelerometer designed to measure acceleration in the Z direction.

When the moving part M has an out-of-plane displacement under the effect of an acceleration along Z, the second parts 6 and third parts 8, due to their low thickness, are deformed in bending.

The second parts 6 are deformed between the first part 4 and the mass (FIG. 5A), their end connected to the mass is subjected to a deformation δx1 in the XY plane along the X direction.

The third parts 8 are deformed between the first part 4 and the substrate S (FIG. 5B), their end connected to the first part is subjected to a deformation δx2 in the XY plane along the X direction.

By making the second and third parts to have similar mechanical behaviours, the amplitudes of deformations δx1, δx2 are similar, and thus they at least partly compensate each other. The non-linear behaviour of the hinge is very much reduced.

The dimensions and materials of the second and third parts are determined such that the amplitude of deformation δx1 is similar to or equal to the amplitude of deformation δx2

Preferably, by choosing that the second part 6 and the third part 8 of each hinge have the same dimensions, the amplitude of deformation δx1 is equal to the amplitude of deformation δx2, and they compensate each other in full. The hinge then has a pure and linear out-of-plane deformation.

FIGS. 7 to 10 show another example of a hinge 102 in which the hinge comprises two third parts 108 located on each side of the second part 106. In this advantageous example, the two third parts 108 have the same length Lm" that is equal to half the length Lm of the second part 106 and the other dimensions Wm" and Tm" of the two third parts are identical to the dimensions Wm and Tm of the second part 106. The two third parts with width Lm"=2 Lm are mechanically equivalent to a single third part with width Lm and therefore have the same in-plane deformation δx2.

It will be understood that the second part that has a certain length can also be replaced by several second parts with the same equivalent dimension.

The equivalent dimension in the Y direction of the second part(s) is equal to the equivalent dimension in the Y direction of the third part(s).

"Equivalent dimension" means the second part or the third part in the Y direction, the dimension of the second part or the third part in the Y direction or the sum of the dimensions of the second parts or the dimensions of the third parts in the Y direction.

As a variant, the hinge comprises two parts on each side of a third part. Also as a variant, the hinge comprises m second parts and n third parts, where m and n are positive integers, and m and n may be equal or different. The second parts and the third parts may or may not be alternating.

In the example given, the lower faces of the second part(s) and third part(s) and the lower face of the first part are in the same plane. As a variant, the lower faces of the second part(s) and third part(s) are located in an arbitrary plane parallel to the XY plane along the Z direction.

Figure 11:
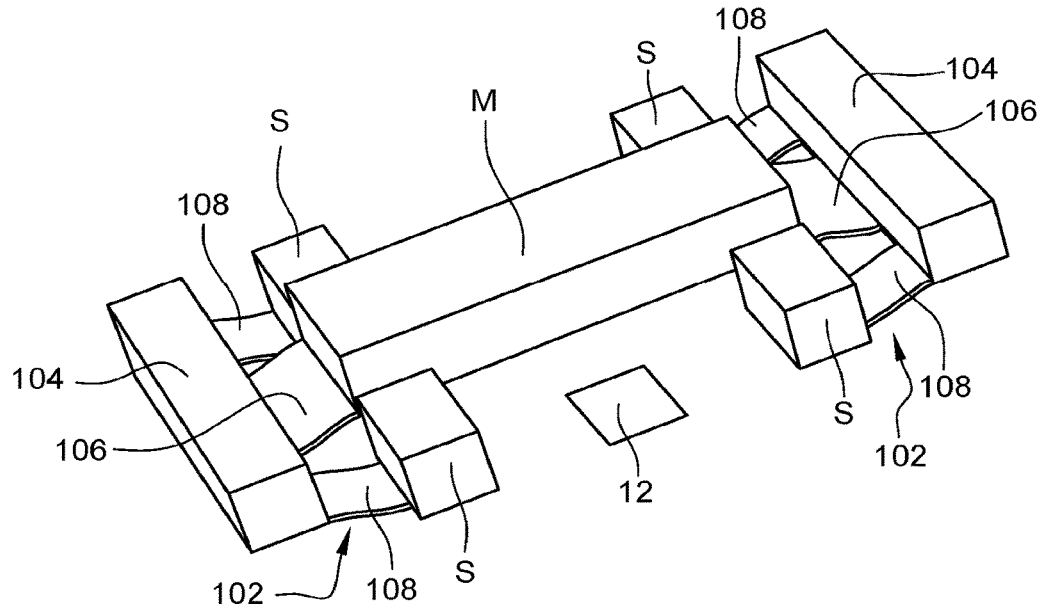
FIG. 11 is a perspective view of an example of an M&NEMS system comprising two hinges in FIG. 7 in an out-of-plane position.
Figure 12A:
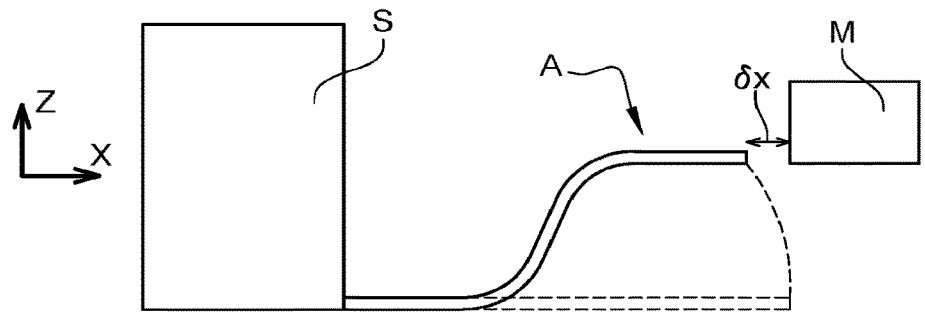
FIG. 12A and FIG. 12B are side views of a MEMS system according to prior art in the rest state and in a state in which the mass is displaced in the out-of-plane direction and illustrating elongation of the hinge.
Figure 12B:
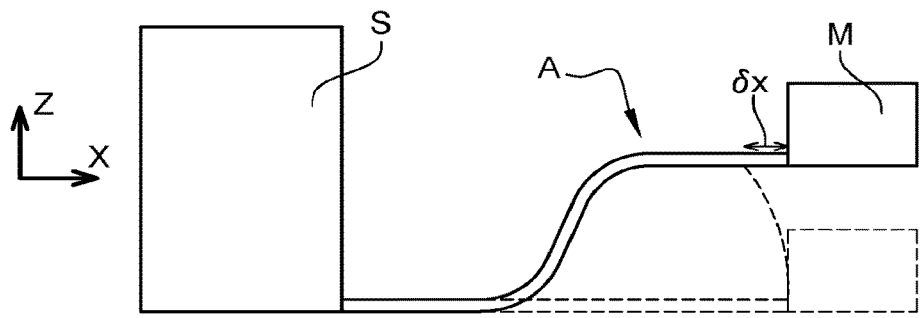
Figure 12C:
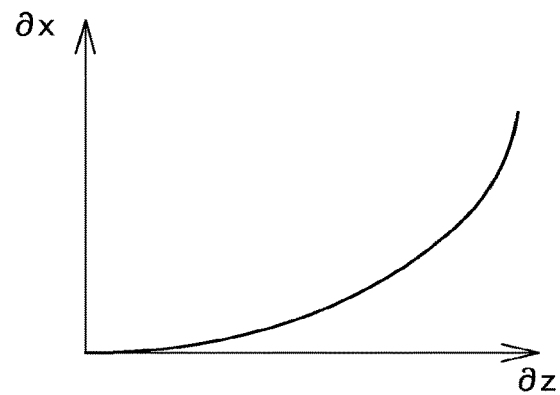
FIG. 12C is a graphic representation of the elongation of the hinge in FIGS. 12A and 12B, along the X direction as a function of the displacement of the mass along the Z direction.

Furthermore in the example shown, the lower face of the second part is in a plane containing the lower face of the moving part. As a variant, the upper face of the second part is in the plane of the upper face of the moving part or in any intermediate plane FIG. 11 shows an example of a MEMS structure comprising two hinges 102 according to the invention, each arranged at one end of the mass M along the X direction. Translational guidance is thus improved. Furthermore, retention in the Y direction is improved.

In another example, the MEMS structure comprises at least three hinges arranged at 120° from each other, even more advantageously four hinges arranged at right angles from each other. The beams of the first parts are oriented at 120° in pairs. The use of at least three hinges improves retention in the other two directions of the plane.

In another example, several hinges are arranged side by side along one side of the moving part, for example two hinges side by side. Preferably, in the case of a rectangular or square shaped mass as seen from above, the hinges are arranged symmetrically at parallel edges.

Furthermore, different numbers of hinges can be used anchored to the edges of the moving part.

Preferably, the second and/or third parts are structured and/or perforated to have shapes providing high flexibility along Z and high in-plane stiffness, for example spiders or lattices are made.

Due to the invention, the stiffness of the hinge can be finely adjusted by choosing the dimensions of the second parts and the third parts.

The hinge according to the invention can be used in MEMS sensors, and means of detecting movement of the mass along Z are provided for this purpose, for example capacitive means or strain gauges, for example piezoresistive, piezoelectric or resonant strain gauges, or piezoelectric layers.

The hinge according to the invention can be used in MEMS actuators and means 12 of actuating the moving part along the Z direction are provided for this purpose, for example electrostatic means shown diagrammatically on FIG. 11. The electrostatic means comprise at least one pair of electrodes, one being formed on the substrate under the moving part M and the other electrode being formed on the moving part M facing the electrode on the substrate S. Application of a potential difference generates electrostatic forces between the two electrodes and therefore an out-of-plane displacement of the moving mass M relative to the substrate S.

Very advantageously, a MEMS system comprising hinges according to the invention can be used to make a microphone. The hinge and the MEMS system can advantageously be fabricated by known microelectronics processes by deposition of layers and etching. For example, examples of fabrication processes described in document FR2941533 can be used to make such a MEMS system.

For example, the membranes are formed by the upper layer of an SOI (Silicon on Insulator) substrate and the first part is made by etching and release. As a variant, the membranes are made by deposition of a layer with a thickness of several hundred nm and the first part is made by etching and release.

For example, the system is made from a semiconducting material such as silicon or SiGe.

The invention claimed is:
1. A microelectromechanical system comprising:
a first element and a second element, said first element and said second element being free to move relative to each other in an out-of-plane direction; and
at least two hinges, each hinge anchored to the first element and to the second element, each hinge comprising:
a first rigid part;
a second part fixed to a first face of the first rigid part by a first end thereof and that is intended to be anchored to the first element or to the second element by a second end thereof, the first and second ends of the second part being considered along a second direction, said second part being configured to be deformable in bending in a first direction; and a third part fixed to the first face of the first rigid part by a first end thereof, and that is intended to be anchored to the second element or to the first element by a second end thereof, the first and second ends of the third part being considered along the second direction, the third part being configured to deform in bending in the first direction, wherein in an undeformed state, the second part and the third part are located in a same plane orthogonal to the first direction, wherein the at least two hinges are oriented such that the first direction is the out-of-plane direction, and the second direction and a third orthogonal to the first direction and to the second direction are in-plane directions, and wherein a thickness of the first rigid part in the first direction is greater than a thickness of the second part in the first direction and a thickness of the third part in the first direction.

2. The microelectromechanical system according to claim 1, wherein the second and third parts are configured to have deformations with similar or identical amplitudes in the second direction, when the hinge is deformed in the first direction.

3. The microelectromechanical system according to claim 1, wherein each hinge comprises in second parts and n third parts, where in and n are positive integers, and m and n may be equal or different.

4. The microelectromechanical system according to claim 3, wherein dimensions in the first direction of the in second parts and the n third parts are similar or equal, and wherein an equivalent dimension of the in second parts in a third direction orthogonal to the first direction and to the second direction is similar to or equal to the equivalent dimension of the n third parts in the third direction.

5. The microelectromechanical system according to claim 1, wherein the first rigid part comprises a beam, a largest dimension of which extends along a third direction orthogonal to the first direction and to the second direction.

6. The microelectromechanical system according to claim 5, wherein dimensions of the first part in the first direction, in the second, and in the third direction are between several μm and several hundred μm.

7. The microelectromechanical system according to claim 1, wherein a dimension of the second part in the first direction is less than its dimensions of the second part in other directions.

8. The microelectromechanical system according to claim 1, wherein dimensions of the second and third parts in the first direction are between about a hundred nm and several microns, dimensions of the second and third parts in the second direction are between several μm and several hundred μm, and equivalent dimensions of the second and third parts in a third direction orthogonal to the first direction and to the second direction are between several μm and several hundred μm.

9. The microelectromechanical system according to claim 1, wherein each hinge comprises one second part and two third parts arranged on each side of the second part.

10. The microelectromechanical system according to claim 1, wherein the second and third parts are each fixed to the first face of the first rigid part in distinct zones.

11. The microelectromechanical system according to claim 1, wherein the first element is a fixed part of the system.

12. The microelectromechanical system according to claim 1, wherein the at least two hinges are arranged symmetrically about a median plane of the second element, said median plane extending in the out-of-plane direction.

13. The microelectromechanical system according to claim 1, comprising at least four hinges and wherein the first parts of each hinge are beams, axes of the beams being orthogonal in pairs.

14. The microelectromechanical system according to claim 1, comprising at least one actuator for moving the second element at least in the out-of-plane direction.

15. The microelectromechanical system according to claim 1, forming a microphone.

16. A microelectromechanical system comprising:
a substrate;
a first element and a second element, said first element and said second element being free to move relative to each other in an out-of-plane direction, the first element being anchored to the substrate; and
a hinge anchored to the first element and to the second element, the hinge comprising:
a first rigid part;
a second part fixed to a first face of the first rigid part by a first end thereof and that is intended to be anchored to the first element or to the second element by a second end thereof, the first and second ends of the second part being considered along a second direction, said second part being configured to be deformable in bending in a first direction; and
a third part fixed to the first face of the first rigid part by a first end thereof, and that is intended to be anchored to the second element or to the first element by a second end thereof, the first and second ends of the third part being considered along the second direction, the third part being configured to deform in bending in the first direction,
wherein in an undeformed state, the second part and the third part are located in a same plane orthogonal to the first direction,
wherein the hinge is oriented such that the first direction is the out-of-plane direction, and the second direction and a third orthogonal to the first direction and to the second direction are in-plane directions, and
wherein a thickness of the first rigid part in the first direction is greater than a thickness of the second part in the first direction and a thickness of the third part in the first direction.

17. The microelectromechanical system according to claim 1, wherein wherein in the undeformed state, lower faces of the first rigid part, the second part, and the third part are located in a same plane orthogonal to the first direction.

18. The microelectromechanical system according to claim 16, wherein wherein in the undeformed state, lower faces of the first rigid part, the second part, and the third part are located in a same plane orthogonal to the first direction.

* * * * *